(12) United States Patent
Orcutt et al.

(10) Patent No.: US 7,457,023 B2
(45) Date of Patent: Nov. 25, 2008

(54) MANUFACTURING A MIRROR PLATE OR OTHER OPERATIONAL STRUCTURE HAVING SUPERIOR FLATNESS BY LASER MILLING FOR USE WITH TORSIONAL HINGED DEVICES

(75) Inventors: John W. Orcutt, Richardson, TX (US); Andrew Steven Dewa, Plano, TX (US); Arthur Monroe Turner, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 11/366,699

(22) Filed: Mar. 2, 2006

(65) Prior Publication Data

US 2007/0053086 A1    Mar. 8, 2007

Related U.S. Application Data

(60) Provisional application No. 60/658,228, filed on Mar. 2, 2005.

(51) Int. Cl.
*G02B 26/08* (2006.01)
(52) U.S. Cl. ........................................ 359/224; 359/872
(58) Field of Classification Search ......... 359/223–226, 359/871, 872, 290, 291
See application file for complete search history.

(56) References Cited

U.S. PATENT DOCUMENTS 6,919,980 B2 *    7/2005    Miyajima et al. ............ 359/224

* cited by examiner

*Primary Examiner*—Euncha P Cherry
(74) *Attorney, Agent, or Firm*—William B. Kempler; W. James Brady, III; Frederick J. Telecky, Jr.

(57) ABSTRACT

A multilevel mirror plate suitable for use with a torsional hinged mirror assembly is laser milled to provide a more effective truss structure in less time and at a reduced cost.

6 Claims, 7 Drawing Sheets

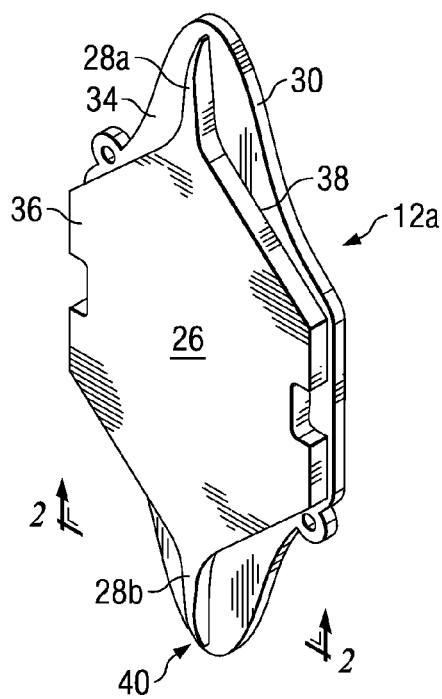
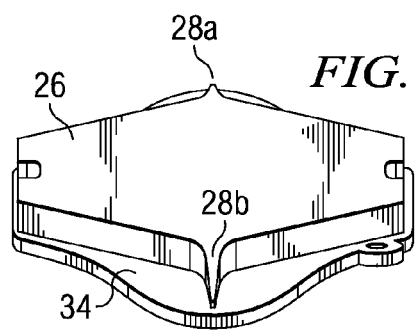
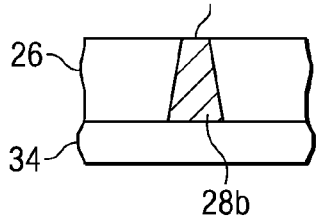
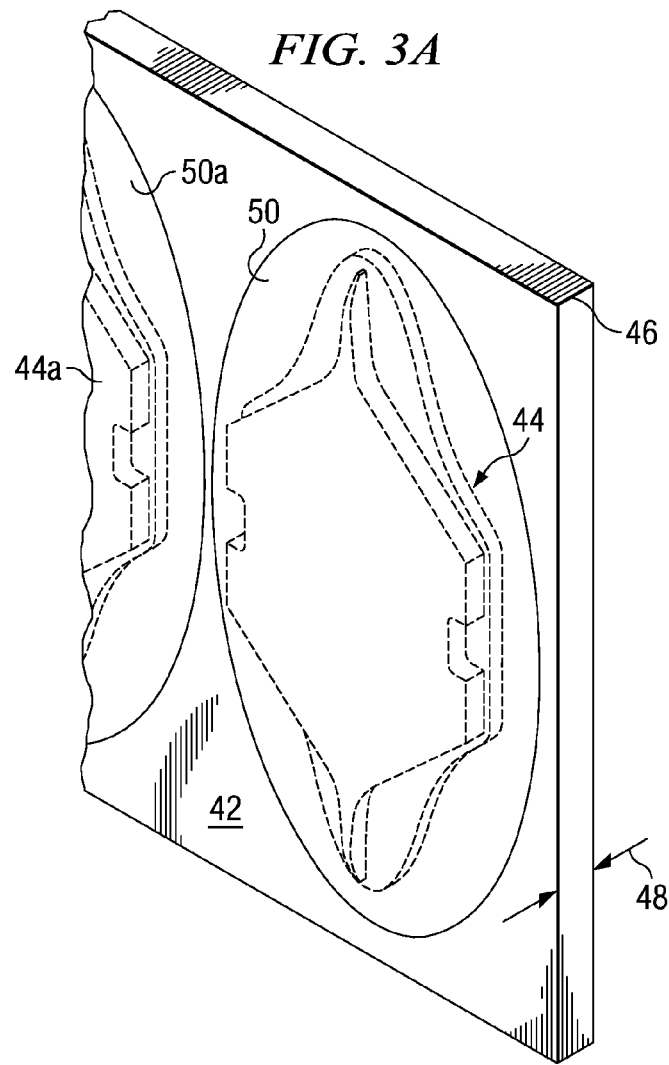

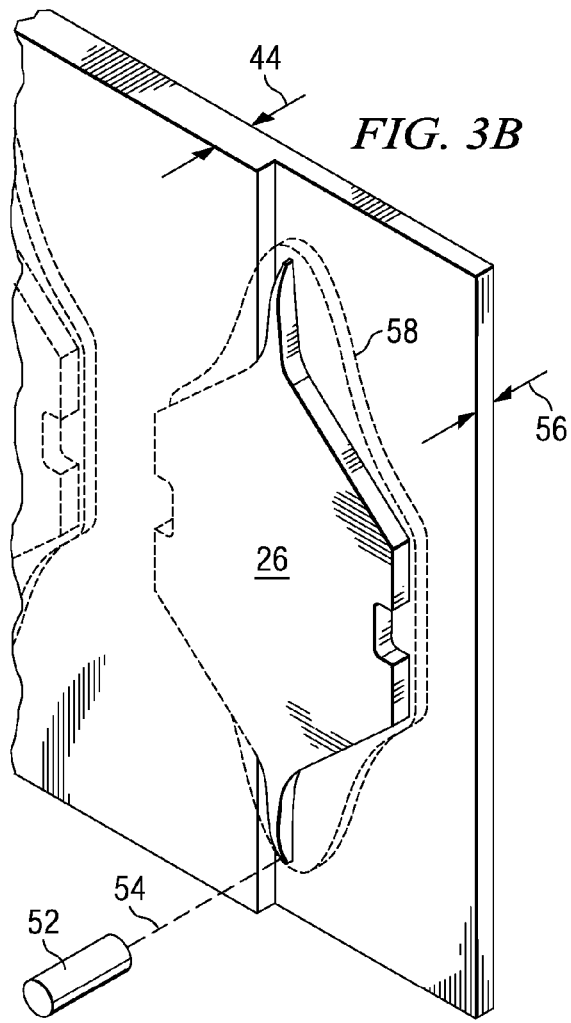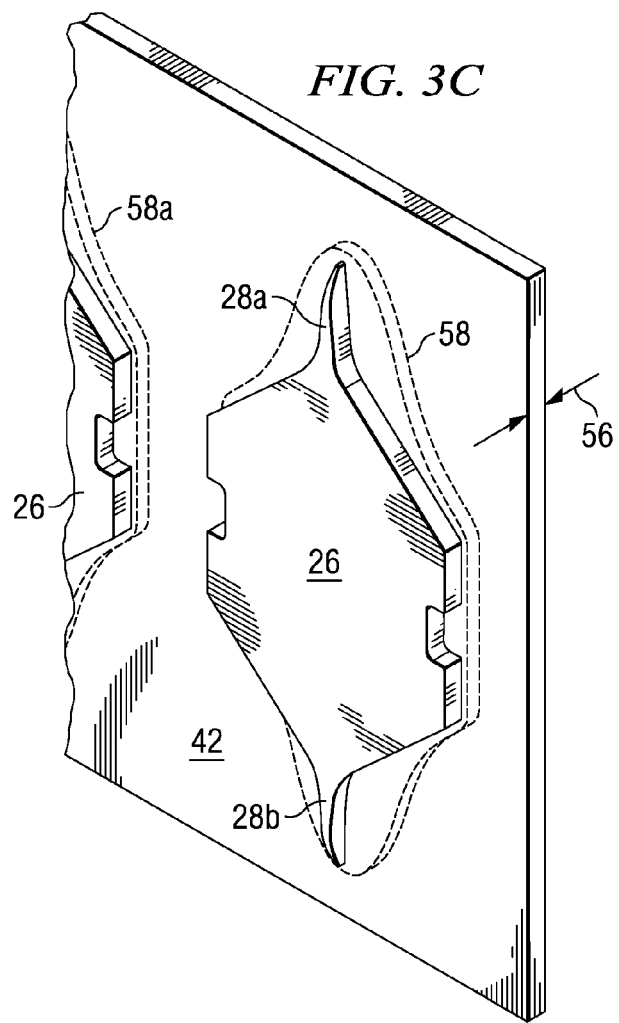

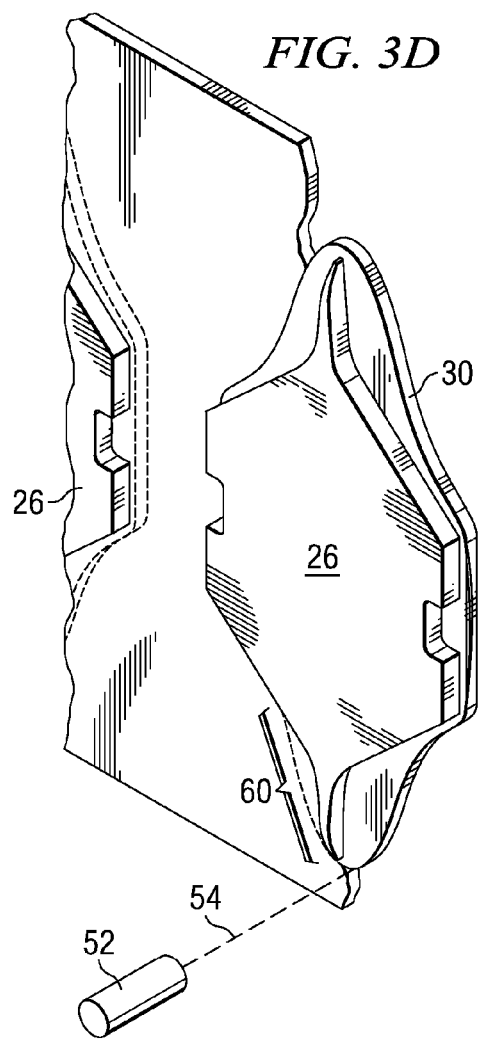
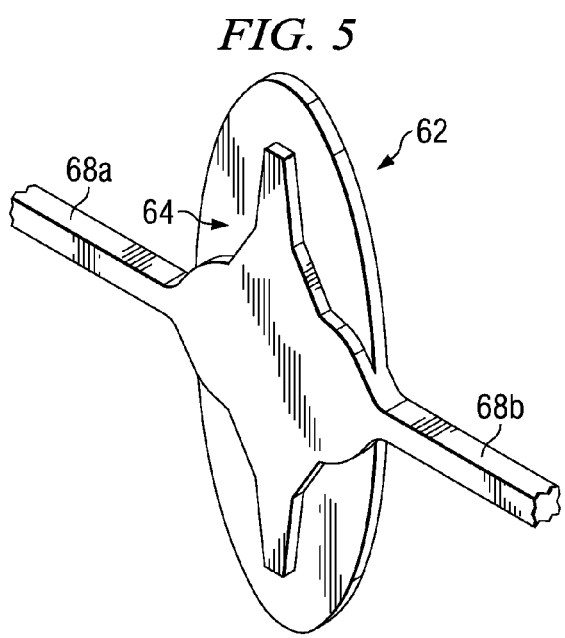
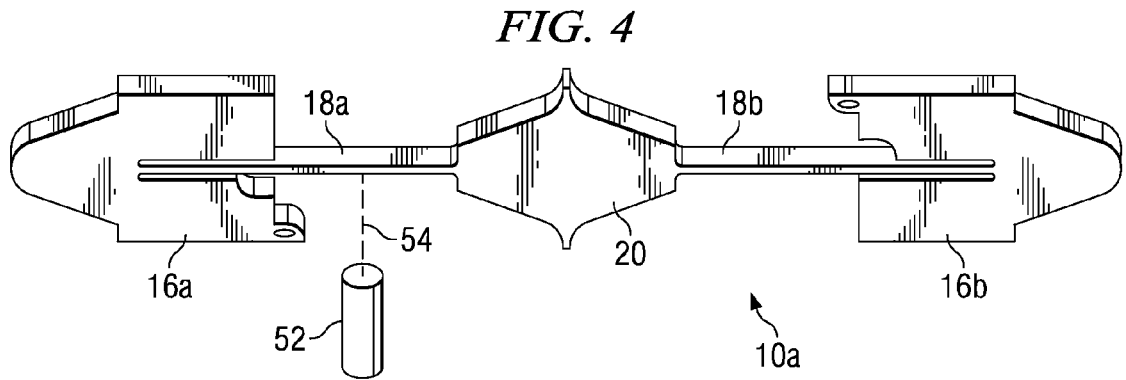

MANUFACTURING A MIRROR PLATE OR OTHER OPERATIONAL STRUCTURE HAVING SUPERIOR FLATNESS BY LASER MILLING FOR USE WITH TORSIONAL HINGED DEVICES

This application claims the benefit of U.S. Provisional Application No. 60/658,228, filed on Mar. 2, 2005, entitled Manufacturing Silicon Torsional Optical Devices Utilizing Laser Milling, which application is hereby incorporated herein by reference.

CROSS-REFERENCE TO RELATED APPLICATIONS

This application relates to the following and commonly assigned patent applications: Ser. No. 11/366,273 filed concurrently herewith, entitled Method Of Adjusting The Resonant Frequency Of An Assembled Torsional Hinged Device, now abandoned, which application is hereby incorporated herein by reference.

TECHNICAL FIELD

The present invention relates to the manufacture of a multilevel mirror plate or other multilevel operational structures for use with torsional hinged devices that rotate or oscillate at high speeds, and more particularly to manufacturing such structures or mirror by laser milling that have superior flatness to similar mirrors manufactured by other techniques.

BACKGROUND

Pivoting or oscillating torsional hinged mirrors provide very effective yet relatively inexpensive replacements for spinning polygon shaped mirrors in printers and some types of displays. As will be appreciated by those skilled in the art, torsional hinged mirrors may be MEMS type mirrors etched from a silicon substrate or wafer using processes similar to those used in the manufacture of semiconductor devices. Some versions of torsional hinge mirrors for providing a raster type scan for printers and displays operate at rotational speeds no greater than about 3 KHz or less, and can be manufactured thick enough so that they avoid serious flatness problems with respect to the reflective surface. However, as the demand for higher print speeds and better resolution increases, flatness of the mirror reflective surface becomes a much more serious problem. As the mirror continuously flexes or bends back and forth during the continuous oscillations about the axis, the greatest deformation is at the tip or ends of the flexing mirror. This problem has been partially eliminated by the use of center spines that extend along the long axis of the elliptical shaped mirror to each of the tips or ends of the mirror. In addition, smaller and even thinner mirrors with even greater rotational speeds are also affected by flexing modes around the mirror edges during high speed operations.

Unfortunately a hinge plate alone with center spines simply is not effective to assure the necessary flatness or to sufficiently reduce the various types of flexing. Of course, the oscillating member, the hinge plate or mirror itself can be made thicker, but this increases the weight and mass to an unsatisfactory level. Consequently, in addition to a hinge plate with center spines, the mirror layer may now be made from a small thicker layer of silicon that is formed or etched at two levels. The front level shape is the thin elongated mirror and the second level shape is a supporting truss structure that also includes center spines. However, even including an etched truss structure does not maximize flatness of the mirror.

Earlier versions of the etched mirror plate or oscillating member simply included center spines that were matched with and bonded to the center spines of the hinge plate. However, some of the high speed mirrors that also flex around the edges of the mirror require more complex truss structures that include ridge members located along selected portions of the mirror edges. These complex truss structures can be etched in the hinge plate alone or in both the hinge plate and the oscillating member.

As will be appreciated by those skilled in the art, the use of such complex truss structures slow the speed of manufacturing and increases the cost. Referring now to FIGS. 8A, 8B, 8C, and 8D, there is shown as an example only, a torsional hinged device manufactured by presently available etching processes. FIG. 8A illustrates an assembled torsional hinged device, which includes a hinge plate 10, a multilevel structure, which in the illustrated example is an oscillating mirror structure 12 bonded to a front side of the hinge plate 10 and a permanent magnet 14 bonded to the back side of the hinge plate 10. FIG. 8B is the hinge plate 10 alone and FIGS. 8C and 8D are two perspective views of the oscillating mirror structure or mirror plate alone. More specifically, and referring to FIG. 8B, the hinge plate 10 includes a pair of support anchors 16a and 16b which will be mounted to a support structure (not shown), a pair of torsional hinges 18a and 18b extending from the support anchors 16a and 16b to a center support member 20 having a front side 22a and a back side 22b. Also included on the central support member 20 are first and second center spines 24a and 24b. The hinge plate 10 was typically formed in the prior art by a single etch process that required a single mask for the single perimeter etch. That is, a layer or wafer silicon of the desired thickness is etched completely through in a single etch process. To assure that the hinges can withstand the stress generated during rotation of the mirror, the single etch process is optimized to form substantially straight and very smooth side walls.

On the other hand, to form the oscillating structure or mirror part of FIGS. 8C and 8D according to the prior art is a two step etching process. For example, there is a first mask and a first etch process that forms the truss structure 26 with spines 28a and 28b as a first level shape. After the first level shape or truss structure 26 with spines 28a and 28b etched in the back side of a silicon layer, a second mask and a second etch process is used to etch completely through the silicon wafer or layer to form the second level or perimeter shape 30 of the oscillating structure or mirror part 12. Since the oscillating structure or mirror part 12 requires two different etch steps, the etching process is optimized for speed. Unfortunately, such fast etching results in undercutting the truss structure such as is clearly shown on the spine 28b by arrows 32a and 32b. As will be appreciated by those skilled in the art, the undercutting results in less mass or material in the area where the first level or truss structure joins the back side of the second level or mirror shaped portion than is present at the very back side 40 of the truss structure. This is exactly opposite of a preferred truss structure, which would include a larger contact area between the two level shapes and a reduced area at the very back surface of the truss structure.

Therefore, it would be advantageous to provide a faster and less expensive method of manufacturing a mirror plate or other structure for use with a torsional hinged device that includes a truss structure having superior flatness and that reduces flexing at the mirror edges.

SUMMARY OF THE INVENTION

These and other problems are generally solved or circumvented, and technical advantages are generally achieved, by preferred embodiments of the present invention, which provide a method of manufacturing a contoured multilevel structure for use with a torsional hinged device or assembly such as a mirror plate. The multilevel structure having reduced flexing at the edges and tip and superior flatness. The multilevel mirror plate or structure is formed from a layer of silicon that includes a front level that defines an operational surface such as a reflective surface and a selected outside perimeter edge. A back level or truss layer of the multilevel structure is formed from the same layer of material as said front level and is integral with the front level and includes a center section and a pair of end sections. Each of the pair of end sections defines a central spine extending from the center section. According to one embodiment, the central spines are contoured to increase flatness of the structure. According to another embodiment, a hinge plate having a pair of torsional hinges is bonded to the truss level of the multilevel mirror structure.

As stated above, the front level shape, and truss level shape of the multilevel structure form a single unitary or integral piece of material, such as for example a silicon substrate layer or wafer having a selected thickness. The mirror plate or silicon substrate layer or wafer includes one or more areas where the mirror plate or multilevel structure will be formed. Although the method of the invention is intended to include the manufacture of a single mirror plate or other superior multilevel structure, preferably the process is used to manufacture a plurality of such devices that are formed in one or more silicon wafers. According to the invention, the back side of a silicon layer such as for example a silicon wafer is laser milled in at least one area and preferably a plurality of areas to remove silicon material according to a first pattern. The silicon material may also be removed to one or more selected depth levels. These one or more depth levels are less than the thickness of the silicon layer. Removal of the silicon material from the at least one area forms the truss or a first level shape of the structure. As will be appreciated by those skilled in the art and as stated above, laser milling allows material to selectively be removed at any level or depth from the top surface of the silicon down to a maximum selected depth. Consequently, the truss can be contoured as a three dimensional (3D) structure so that the area or junction at the intermediate level that joins the second level shape with the front portion or first level shape is substantially larger than the contoured top surface portion of the truss level structure. Thus, the problem of undercutting the center spines that occurred with etching the multilevel mirror structure is not only avoided but the 3D contouring allows more material and mass to be removed from the top surface portion. The excess material at the top surface portion is of little or no value. The portions of the truss structure that joins the front level or mirror level shape is not reduced and therefore there is no loss of support. Furthermore, the 3D contouring also results in a flatter mirror or structure.

After the first level or truss level shape of the structure is formed, a second milling is used to cut through the layer of silicon to define the outside perimeter shape or the second level shape of the structure. The second laser cut also singulates or separates the mirror plate structure from the wafer or silicon layer.

According to another embodiment, a hinge plate having a front side and a back side is bonded to the truss level or back layer of the operational member. The hinge plate also includes a center section, which is integral with a pair of torsional hinges that extend away from the center section. Similar to the back layer of the multilevel mirror structure, the hinge plate may also include a first and a second end section. Each of the end sections of the hinge layer defining a central spine that extends away from the center section along the first axis. To complete the manufacture of a torsional hinged oscillating mirror or other device, according to this embodiment, the center section and the central spine of the multilevel mirror member are aligned with the center section and central spine of the hinge plate. The aligned center sections and central spines are then bonded together to form the torsional hinged assembly.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1A and 1B are two different perspective views of a multilevel mirror structure formed according to the teachings of the present invention;

FIG. 2 is a cross-sectional view of the multilevel mirror structure of FIG. 1A along section lines 2-2;

FIGS. 3A-3D represent various stages of laser milling the multilevel mirror structure of FIG. 1A;

FIG. 4 illustrates the single plate being laser milled;

FIG. 5 illustrates a multilevel mirror with torsional hinges laser milled from a single layer of silicon;

DETAILED DESCRIPTION OF ILLUSTRATIVE EMBODIMENTS

The presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 8B:
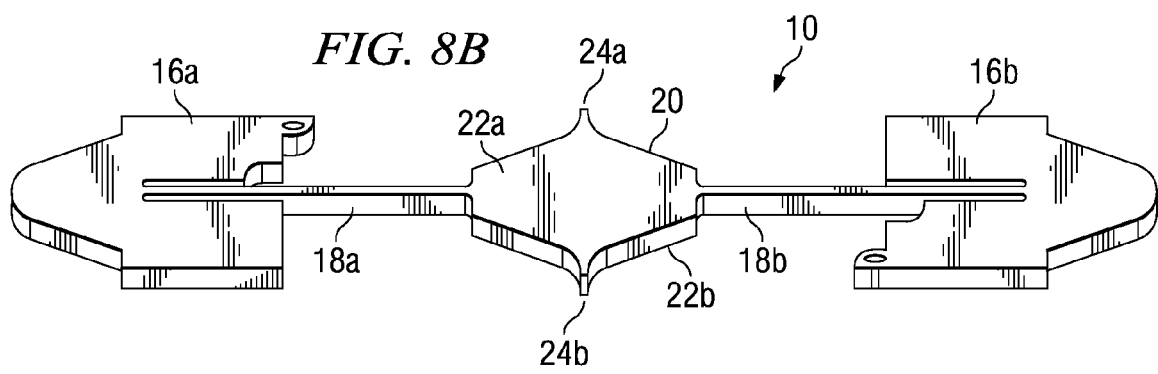
FIG. 8B is a hinge plate component of the prior art assembly of FIG. 8A.
Figure 8A:
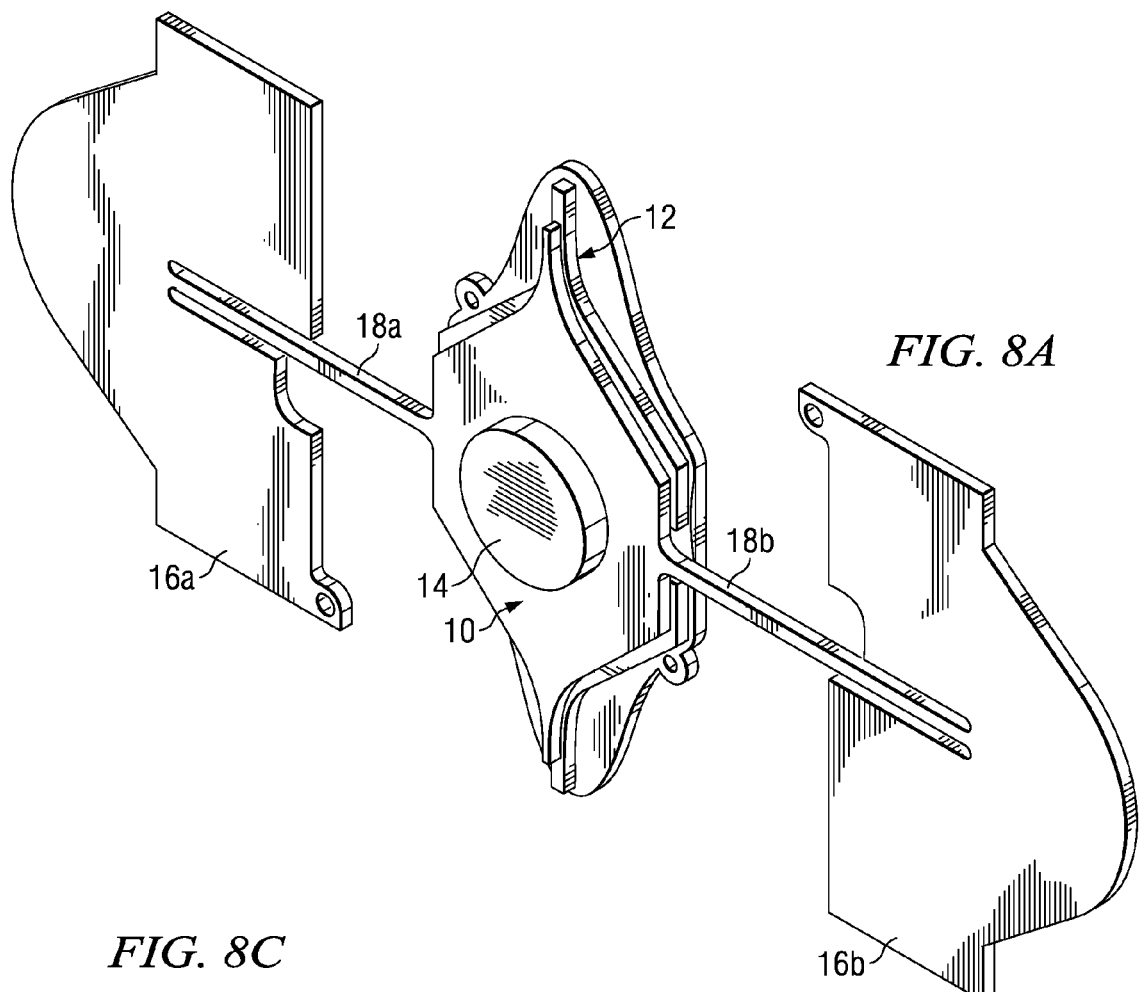
FIG. 8A is a perspective view of a torsional hinged mirror assembly formed according to a prior art method.
Figure 8C:
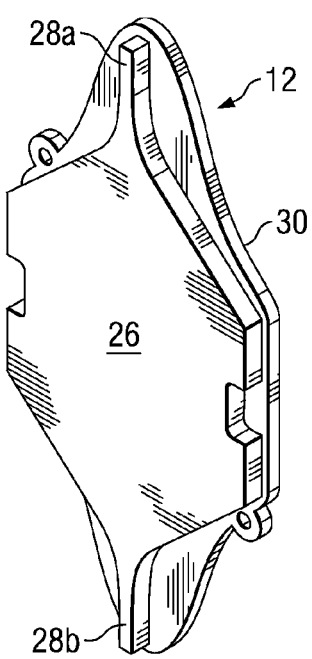
FIGS. 8C and 8D are two perspective views of the multilevel mirror structure of the prior art assembly of FIG. 8A.
Figure 8D:
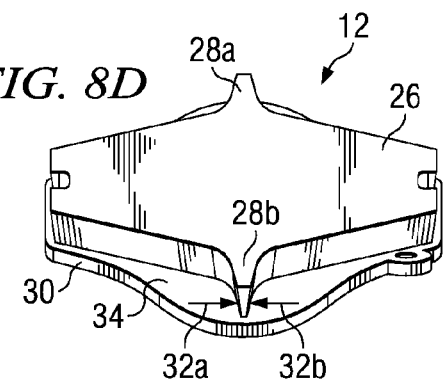
Figure 9A:
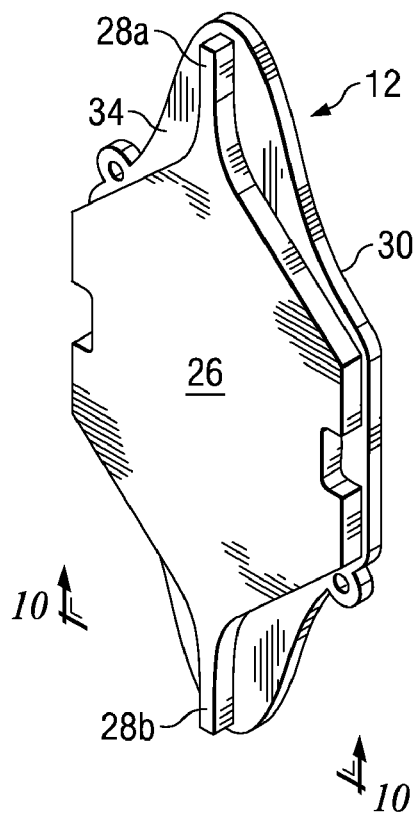
FIGS. 9A and 9B are two further perspective views of a multilevel mirror plate or structure formed according to prior art methods.
Figure 9B:
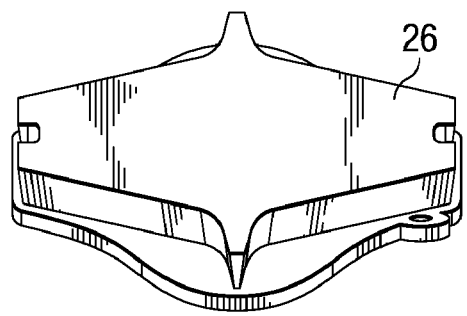
Figure 10:
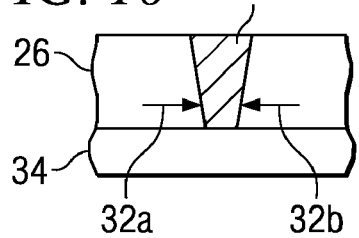
FIG. 10 is a cross-section area of FIG. 9A along line 9-9.

Referring now to FIGS. 1A and 1B, there is shown two perspective back views of a multilevel structure mirror formed according to the teachings of the present invention. The multilevel mirror structure is suitable for use as a component of a torsional hinged oscillating mirror, such as for example, a resonant mirror. As can be seen from FIGS. 1A and 1B, the multilevel mirror structure 12a is similar to the mirror shape discussed in the prior art FIGS. 8C and 8D. As shown, there is a first level shape or truss structure 26 formed integral with a mirror level or second level shape 34 that defines the outside perimeter 30 of the multilevel mirror structure. As shown, the truss structure 26 may also include spines 28a and 28b that extend from a center section 36 substantially to the tips of the mirror level or second level shape 34. However, advantageously the spines 28a and 28b are not undercut as they were in the prior art embodiments of FIGS. 8C and 8D. In fact, according to a preferred embodiment, the spines 28a and 28b are broader at the intersection or junction 38 of the second level shape 34 and the first level shape or truss structure 26. The spines 28a and 28b may then be further contoured or feathered by removal of additional material as the depth or thickness of the spines approaches the back most surface of the truss level 26 and as indicated by reference number 40 in FIGS. 1A, 1B and 2. Such contouring results in a stronger structure with less weight and increased flatness. FIGS. 9A and 9B and FIG. 10 represent further views of the prior art structures discussed with respect to FIGS. 8A-8D and provide a clear illustration of the undercut spines (arrows 32a and 32b of FIG. 10) of the prior art compared to the contoured spines formed according to the present invention.

FIGS. 3A-3D illustrate the manufacture of the multilevel structure of FIGS. 1A and 1B by laser milling. As shown, FIG. 3A illustrates a solid layer of silicon or a substrate 42 from which at least one and preferably a plurality of multilevel mirror structures will be formed. The multilevel structures 44 and 44a that will be formed in the silicon layer 42 by the laser milling are shown in dotted lines as examples only. Although the silicon substrate 42 is shown with a square corner 46, it will be appreciated that the silicon substrate 42 will preferably be a round silicon wafer similar to wafers used in the manufacture of semiconductor circuits. Substrate 42 is shown with a selected thickness represented by double arrows 48. There is also illustrated a first area 50 and second area 50a of the substrate 42 in which the multilevel mirror structure 44 (or other structures) will be formed by laser milling. FIG. 3B represents the silicon substrate 42 as it is laser milled to form the truss level shape or structure 26 of the multilevel mirror structure 44. As shown, laser source 52 generates a laser beam 54 that removes silicon material from the back side of the silicon substrate 42 down to any desired level that is equal to or less than a maximum depth. The maximum depth is, of course, typically less than the total selected thickness of the silicon substrate as represented by arrow 48 as discussed above. As will be appreciated by those skilled in the art of laser milling, the depth of material removed during the forming of the truss structure can be controlled to substantially any amount from just grazing the back most surface of the layer 42 down to the maximum depth as shown in FIG. 3B, such that a thin layer is left for the mirror or reflective portion of the multilevel structure as indicated by double arrows 56. The dotted lines 58 in FIG. 3B do not represent an actual structure at this stage of the laser milling but shows where the subsequent outside perimeter cut will occur. FIG. 3C illustrates the substrate 42 after a plurality of truss structures 26, similar to the truss structure shown in 3C, have been laser beam milled into the substrate, but before the final cutting or milling step through the thinned substrate 42. Referring now to FIG. 3D, there is illustrated how the laser beam 54 cuts completely through the remaining thin layer of silicon to form the outside perimeter shape 30 of the multilevel mirror structure 44. As shown in FIG. 3D, the laser has cut through the thinned silicon layer 42 in all areas except where they are still dotted lines as indicated by bracket 60. A portion of the thinned layer 42 is shown broken away to illustrate the final structures of the multilevel mirror plate after separation.

As was discussed with respect to the prior art structure of FIGS. 8A-8D, a preferred structure for a torsional hinged mirror includes the multilevel mirror structure, discussed above, bonded to a hinge plate that includes the torsional hinges. FIG. 4 illustrates that the hinge plate 10a could also be completely formed by laser milling as well as by etching. It should also be appreciated that the torsional hinges 18a and 18b of the hinge plate 10a could be etched, while the rest of the hinge plate is formed by laser milling.

Laser milling could also be used to manufacture a torsional hinged mirror made of a single piece of silicon. Referring to FIG. 5, there is illustrated an embodiment of a complete torsional hinged mirror structure 62 that is somewhat similar to the structure discussed above with respect to FIG. 1A through FIG. 3D. However, as shown, the structure of FIG. 5 is made from a single layer of silicon 64 and also includes a pair of torsional hinges 66a and 66b that are laser milled from the same silicon substrate or wafer 64 as an integral structure with the multilevel mirror structure. However, the torsional hinges are preferably laser milled at a slower rate than the truss structure and/or outside perimeter of the mirror structure to assure smoother sides. As discussed above, the smooth sides will accommodate greater stress than rough sides.

Referring again to FIG. 4, there is a hinge plate 10a being laser milled from a silicon substrate layer or wafer. As was the case with the multilevel mirror structures discussed above, a single hinge plate 60a may be cut or milled from the silicon layer, but preferably a plurality of hinge plates are formed in each substrate. In addition, FIG. 5 illustrates that a hinge plate 10a can be milled by a single laser milling step that cuts completely through the silicon layer. However, as was mentioned above, the rate of milling the torsional hinges should be slower than milling the remainder of the hinge plate to form smoother side walls on the hinges.

FIGS. 6A-6D illustrate in various perspective assembled views, a mirror structure or plate 12a and hinge plate 10a formed according to the teachings of the present invention. As shown, both the mirror plate 12a and the hinge plate 10a are contoured and include feathered edges and/or surfaces to remove a significant amount of silicon material and thereby reduce the weight of the assembled structure. Removing the material and weight by contouring and feathering maintains the advantages of the supporting center section and spines on both the hinge plate 10a and mirror plate 12a. More specifically, as shown, the back surface of the center section 20 and spines 24a and 24b of the hinge plate 10a are highly contoured and feathered as indicated by arrows 67 to round off the back surface and remove material without sacrificing the strength and support provided by the spines 24a and 24b. The removal of material and mass from the contoured spines also results in superior flatness. Likewise, the back surface of the center section 36 and spines 28a and 28b of the mirror plate 12a are also rounded, contoured, and feathered to remove material and weight without sacrificing strength and support.

Figure 6A:
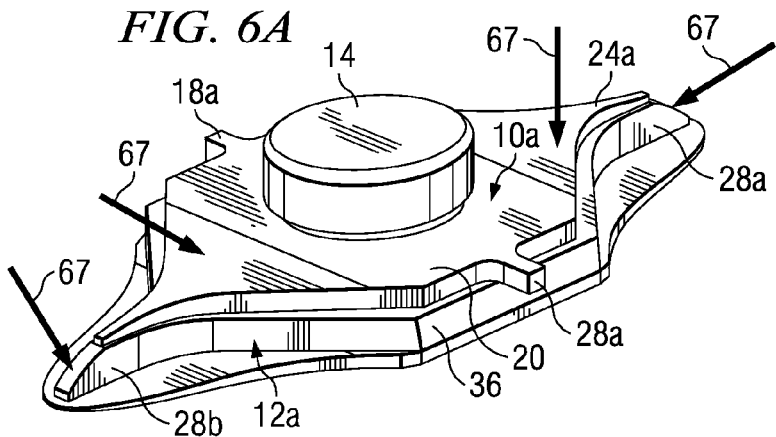
FIGS. 6A-6D are perspective views of an assembled torsional hinged mirror structure formed and contoured according to the teachings of the present invention.
Figure 6B:
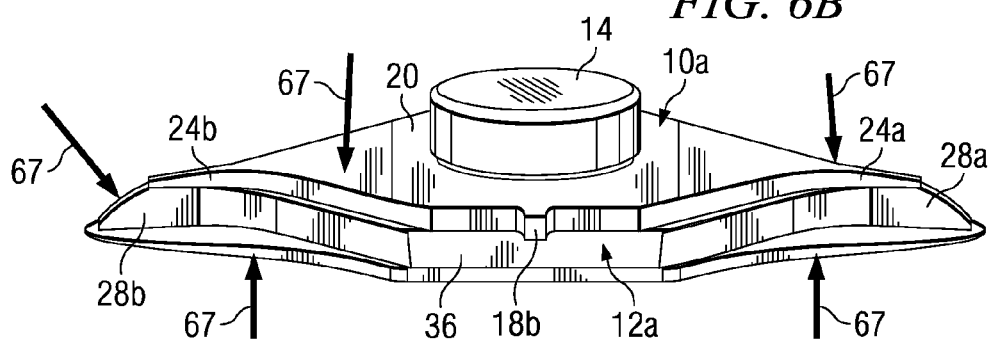
Figure 6C:
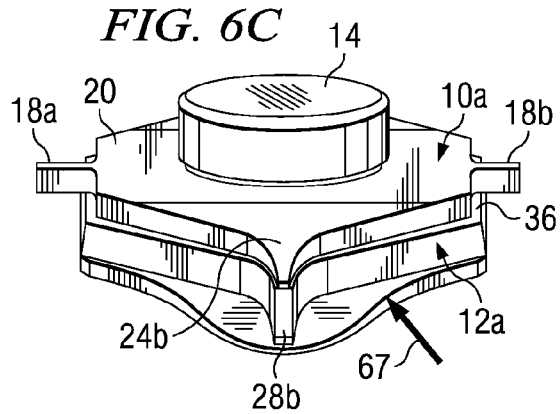
Figure 6D:
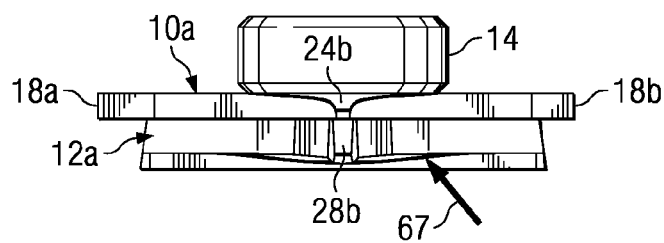
Figure 7:
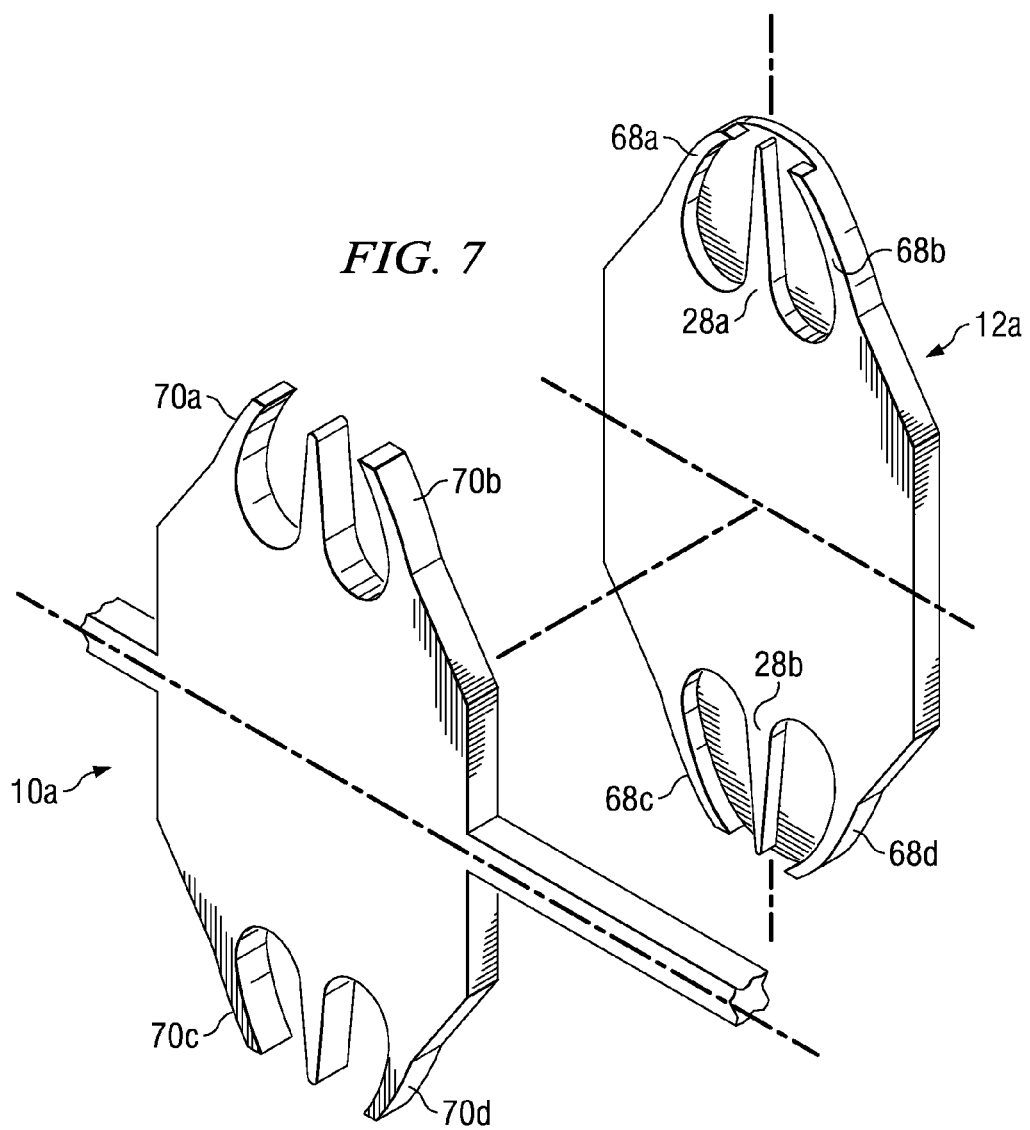
FIG. 7 illustrates a multilevel mirror structure and hinge plate having a more complex shape.

FIG. 7 illustrates that a more complex truss structure for the mirror portion and/or hinge plate can also be milled into the silicon if needed to help prevent excessive flexing of the edges. As shown, FIG. 7 includes perimeter ridge 68a-68b and 70a-70d on the mirror plate 72 and the hinge plate 74 respectively.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the mirror assembly described in the specification. As one of ordinary skill in the art will readily appreciate from the disclosure of the present invention mirror assembly later to be developed, that perform substantially the same function or achieve substantially the same result as the corresponding embodiments described herein may be utilized according to the present invention. Accordingly, the appended claims are intended to include within their scope such mirror assembly.

What is claimed is:

1. A mirror structure for use with a torsional hinged mirror assembly, said mirror structure having less mass, increased strength and superior flatness, said mirror structure comprising:
    a layer of material having a selected thickness, a first side having a reflective surface and a back side patterned to have a mirror level and a truss level;
    said mirror level extending from said reflective surface for a selected distance to an intermediate level and defining an outside perimeter; and
    said back side shaped and contoured to define a three dimensional pattern that includes a multiplicity of selected thicknesses formed by continuously contouring and feathering elements of the three dimensional pattern that extend from said intermediate level up to said back side to form said truss level.

2. The mirror structure of claim 1 wherein said outside perimeter defines an elongated mirror that extends from a first tip area to a second tip area and wherein said truss level defines a pair of spines extending from a center section toward said first and second tip areas along said intermediate level.

3. The mirror structure of claim 2 wherein said back side is contoured and shaped to have less material at the back most surface than at the intermediate level where said mirror level joins said truss level.

4. The mirror structure of claim 1 further comprising:
    a hinge plate formed from a silicon layer, said hinge plate comprising a center section and a pair of torsional hinges extending away from said center section, said hinge plate bonded to said mirror structure to form said torsional hinged mirror assembly.

5. The mirror structure of claim 4 wherein said hinge plate includes contoured spines.

6. The mirror structure of claim 1 wherein said material is silicon.

* * * * *